United States Patent
Wu

(10) Patent No.: US 6,586,311 B2
(45) Date of Patent: Jul. 1, 2003

(54) SALICIDE BLOCK FOR SILICON-ON-INSULATOR (SOI) APPLICATIONS

(75) Inventor: David Donggang Wu, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/843,336

(22) Filed: Apr. 25, 2001

(65) Prior Publication Data

US 2002/0158291 A1 Oct. 31, 2002

(51) Int. Cl.[7] .............................................. H01L 21/20
(52) U.S. Cl. ...................... 438/382; 438/330; 438/583; 438/649
(58) Field of Search ................. 438/581, 583, 438/630, 649, 651, 655, 721, 755, 210, 329, 382, 330, 242, 243, 386; 257/379, 516, 536, 301, 302

(56) References Cited

U.S. PATENT DOCUMENTS

| | | | |
|---|---|---|---|
| 5,352,923 A | 10/1994 | Boyd et al. | 257/536 |
| 5,656,524 A | 8/1997 | Eklund et al. | 438/238 |
| 5,930,638 A * | 7/1999 | Reedy et al. | 438/382 |
| 6,350,652 B1 * | 2/2002 | Libera et al. | 438/257 |
| 6,365,481 B1 * | 4/2002 | Bonser et al. | 438/382 |

FOREIGN PATENT DOCUMENTS

| | | | |
|---|---|---|---|
| EP | 0145926 | 11/1984 | ........... H01L/21/31 |
| EP | 07321327 | 12/1995 | ......... H01L/29/786 |
| EP | 2001250869 | 9/2001 | ....... H01L/21/8234 |
| WO | 01/06554 A1 | 1/2001 | ....... H01L/21/3205 |

OTHER PUBLICATIONS

Hong Liao, Soh Yun Siah and David Vigar; *The Importance of Oxide Capping on the Suppression of Dopant Outdiffusion for Salicide Block Process*, 2000, 118–123.

International Search Report dated Aug. 16, 2002 for International application No. PCT/US02/02845 Filed Feb. 1, 2002.

* cited by examiner

Primary Examiner—Tom Thomas
Assistant Examiner—Douglas W. Owens
(74) Attorney, Agent, or Firm—William, Morgan & Amerson

(57) ABSTRACT

A method is provided, the method comprising forming a buffer layer above a structure layer, and forming a dielectric layer above the buffer layer. The method also comprises patterning the dielectric layer to form a salicide block above a portion of the structure layer protecting the portion from a subsequent salicidation. A device is also provided, the device comprising a buffer layer above a structure layer and a dielectric layer above the buffer layer. The dielectric layer is patterned to form a salicide block above a portion of the structure layer to protect the portion from a subsequent salicidation.

9 Claims, 10 Drawing Sheets

US 6,586,311 B2

SALICIDE BLOCK FOR SILICON-ON-INSULATOR (SOI) APPLICATIONS

BACKGROUND OF THE INVENTION

1. Field of the Invention

This invention relates generally to semiconductor fabrication technology, and, more particularly, to a method for semiconductor fabrication supervision and optimization.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors.

Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires being able to form and pattern components such as the gate conductor and gate dielectric on such reduced scales, consistently, robustly and reproducibly, preferably in a self-aligned manner. Moreover, reducing the channel length of a transistor also requires reducing the size and area of electrical contacts to active areas, such as $N^+$ ($P^+$) source/drain regions and a doped-polycrystalline silicon (doped-polysilicon or doped-poly) gate conductor. As the size and area of the electrical contacts to the active areas get smaller, the active area contact resistance increases. Increased active area contact resistance is undesirable for a number of reasons. For example, increased active area contact resistance may reduce device drive current, and source/drain current through the device, and may also adversely affect the overall speed and operation of the transistor.

Typically, depositing titanium (Ti) or cobalt (Co) on the active area electrical contacts may decrease active area contact resistance. The cobalt (Co) may then be silicided by annealing with a heat-treatment to form cobalt silicide ($CoSi_2$) at the active area electrical contacts (self-aligned silicidation or salicidation). The salicided $CoSi_2$ lowers active area contact resistance.

As shown in FIG. 1, a metal oxide semiconductor field effect transistor (MOSFET or MOS transistor) 100 may be formed on a semiconducting substrate 105, such as doped-silicon. The MOS transistor 100 may have a doped-poly gate 115 formed above a gate dielectric 110 formed above the semiconducting substrate 105. The doped-poly gate 115 and the gate dielectric 110 may be separated from $N^+$-doped ($P^+$-doped) source/drain regions 120 of the MOS transistor 100 by dielectric spacers 125. The dielectric spacers 125 may be formed above $N^-$-doped ($P^-$-doped) source drain extension (SDE) regions 130.

The $N^-$-doped ($P^-$-doped) source drain extension (SDE) regions 130 are typically provided to reduce the magnitude of the maximum channel electric field found close to the $N^+$-doped ($P^+$-doped) source/drain regions 120 of the MOS transistor 100, and, thereby, to reduce the associated hot-carrier effects. The lower (or lighter) doping of the $N^-$-doped ($P^-$-doped) source drain extension (SDE) regions 130, relative to the $N^+$-doped ($P^+$-doped) source/drain regions 120 of the MOS transistor 100, reduces the magnitude of the maximum channel electric field found close to the $N^+$-doped ($P^+$-doped) source/drain regions 120 of the MOS transistor 100, but increases the source-to-drain resistances of the $N^-$-doped ($P^-$-doped) source drain extension (SDE) regions 130.

As shown in FIG. 2, a cobalt (Co) metal layer 235 may be blanket-deposited on the MOS transistor 100 shown in FIG. 1, following a pre-cleaning dip performed to remove residual dielectric material from areas to be salicided. The cobalt (Co) metal layer 235 may then be subjected to an initial rapid thermal anneal (RTA) process performed at a temperature ranging from approximately 450–800° C. for a time ranging from approximately 15–60 seconds. At surfaces 240 of active areas 245, such as the $N^+$-doped ($P^+$-doped) source/drain regions 120 and the doped-poly gate 115, exposed silicon (Si) reacts upon heating with the cobalt (Co) metal layer 235 to form cobalt silicide ($CoSi_2$) at the surfaces 240 of the active areas 245. The cobalt (Co) metal layer 235 is not believed to react with the dielectric spacers 125 upon heating.

As shown in FIG. 3, a wet chemical strip of the cobalt (Co) metal layer 235 removes excess, unreacted portions (not shown) of the cobalt (Co) metal layer 235, leaving behind the salicided cobalt silicide ($CoSi_2$) 350 only at and below the surfaces 240 of the active areas 245. The salicided cobalt silicide ($CoSi_2$) 350 may then be subjected to a final rapid thermal anneal (RTA) process performed at a temperature ranging from approximately 600–1000° C. for a time ranging from approximately 10–60 seconds.

Unsalicided resistors have found many applications in complementary metal oxide silicon (CMOS) semiconductor technology. For example, a layer of polysilicon disposed in a semiconducting substrate may form a portion of a resistor. However, unless protected by an overlying salicide block, the layer of polysilicon disposed in the semiconducting substrate would become salicided during a subsequent salicidation process, as described above. The silicidation of the layer of polysilicon would render the resistor much less resistive. Consequently, a conventional salicide block formed of a single layer of silicon dioxide ($SiO_2$) or tetraortho silicate (TEOS) is typically formed above such a resistor. However, in the formation of conventional salicide blocks, there is little selectivity to field oxide and/or silicon (Si) during the salicide block etch, performed to form the salicide block. Since an overetch is typically performed (to ensure substantially complete removal of extraneous salicide block material for increased salicidation in other areas of the workpiece), the silicon (Si) loss and/or the field oxide loss can be very significant, particularly in silicon-on-insulator (SOI) applications. In silicon-on-insulator (SOI) applications, the silicon (Si) film and/or the field oxide thickness are much less than in "bulk" applications.

Conventional semiconductor devices may be referred to as "bulk" devices, because bulk devices include a substantially monocrystalline semiconducting bulk substrate in which the active and/or passive circuit elements are disposed. More recently, silicon-on-insulator (SOI) devices have been introduced that consume less power than do bulk devices, an important advantage in many applications such as battery-powered mobile telephones and battery-powered laptop computers. Also, silicon-on-insulator (SOI) devices advantageously operate at higher speeds than do bulk devices.

Silicon-on-insulator (SOI) devices may be characterized by having a thin layer of insulating dielectric material (for example, a buried oxide or nitride or other suitable insulating layer) sandwiched between a bulk semiconducting substrate and the circuit elements of the device. Typically, no other layers of material are interposed between the buried dielectric layer and the bulk substrate. As used herein, the circuit elements establish a circuit component, such as an active transistor or a passive component (e.g., resistor).

In a silicon-on-insulator (SOI) device, the circuit elements above the buried dielectric layer are established in regions of a thin film of substantially monocrystalline semiconducting layer, often bonded and/or grown epitaxially, that are separated from each other by insulating dielectric regions (of field oxide, for example). The (epitaxial) semiconducting layer may be n-doped or p-doped as appropriate with N-type or P-type conductivity dopants. For example, the (epitaxial) semiconducting layer may include a body region having a P-type dopant, the body region being disposed between source/drain regions. The source/drain regions may be doped with an N-type dopant. Such a structure may be used to form an N-channel metal oxide silicon field effect transistor (MOSFET or MOS transistor) or a lateral NPN bipolar transistor, for example.

The silicon-on-insulator (SOI) technology offers a number of advantages relative to traditional transistor formation in a bulk silicon wafer. For example, bulk silicon transistors have their active terminals disposed adjacent the bulk silicon wafer. As a result, parasitic capacitance is present at the junction between the source/drain regions of an MOS transistor and the well or bulk silicon substrate. Other problems with bulk silicon transistors include the possibility of junction breakdown between the source/drain regions and the wafer, together with the formation of undesired parasitic bipolar transistors giving rise to device latch-up problems.

In contrast, silicon-on-insulator (SOI) transistors have active regions (for example, the source/drain and channel regions of an MOS transistor) formed adjacent an underlying insulating layer. As such, these silicon-on-insulator (SOI) transistors protect against and/or significantly reduce the formation of undesired parasitic elements. The silicon-on-insulator (SOI) technology also significantly reduces junction capacitance and junction leakage due to the reduced exposed junction area. This reduced parasitic capacitance leads to increased performance and higher density integrated circuits. Also, silicon-on-insulator (SOI) transistors offer inherent radiation hardness, better high temperature performance, higher current driving ability, and lower leakage current.

One disadvantage with silicon-on-insulator (SOI) devices is that the voltage in the body region of the device tends to vary, or "float." This is sometimes referred to as a floating body. Consequences of floating body silicon-on-insulator (SOI) devices include output current kinks, anomalous subthreshold currents, transient current overshoot, and early device breakdown.

Silicon-on-insulator (SOI) techniques offer, however, additional advantages. In some cases, it uses simpler fabrication sequences and resultant cross-sections compared to circuits fabricated in bulk silicon. Silicon-on-insulator (SOI) techniques also provide reduced capacitive coupling between various circuit elements over the entire integrated circuit (IC) chip, and, in CMOS circuits, latchup is substantially reduced. Silicon-on-insulator (SOI) techniques reduce chip size and/or increase packing density, and minimum device separation is determined only by the limitations of photolithography. Moreover, silicon-on-insulator (SOI) techniques provide increased circuit speed, due in part to reductions in parasitic capacitance and chip size.

The present invention is directed to overcoming, or at least reducing the effects of, one or more of the problems set forth above.

SUMMARY OF THE INVENTION

In one aspect of the present invention, a method is provided, the method comprising forming a buffer layer above a structure layer, and forming a dielectric layer above the buffer layer. The method also comprises patterning the dielectric layer to form a salicide block above a portion of the structure layer protecting the portion from a subsequent salicidation.

In another aspect of the present invention, a device is provided, the device comprising a buffer layer above a structure layer and a dielectric layer above the buffer layer. The dielectric layer is patterned to form a salicide block above a portion of the structure layer to protect the portion from a subsequent salicidation.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
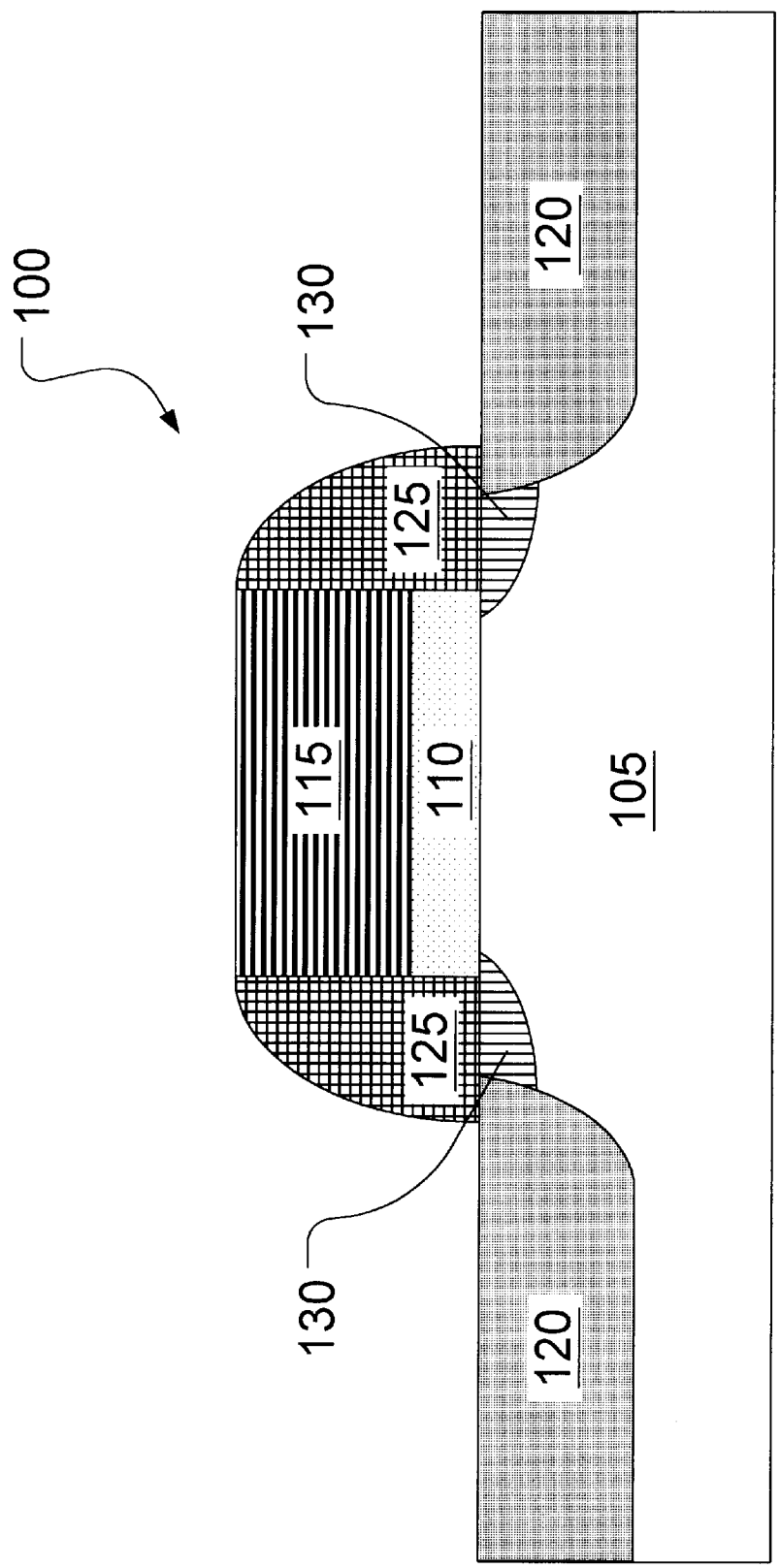
FIGS. 1–3 schematically illustrate conventional self-aligned silicidation (salicidation) for a metal oxide semiconductor field effect transistor (MOSFET or MOS transistor)
Figure 2:
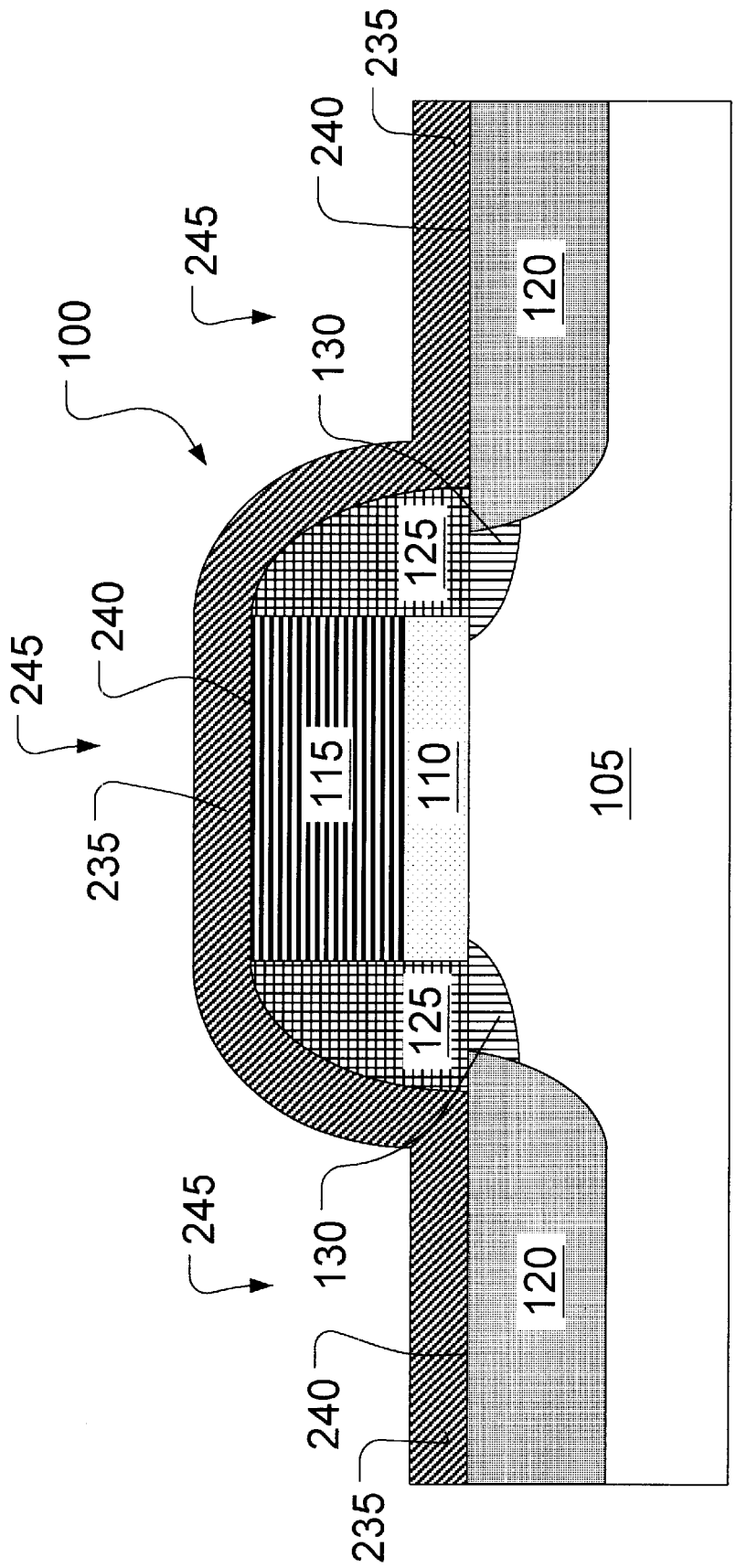
Figure 3:
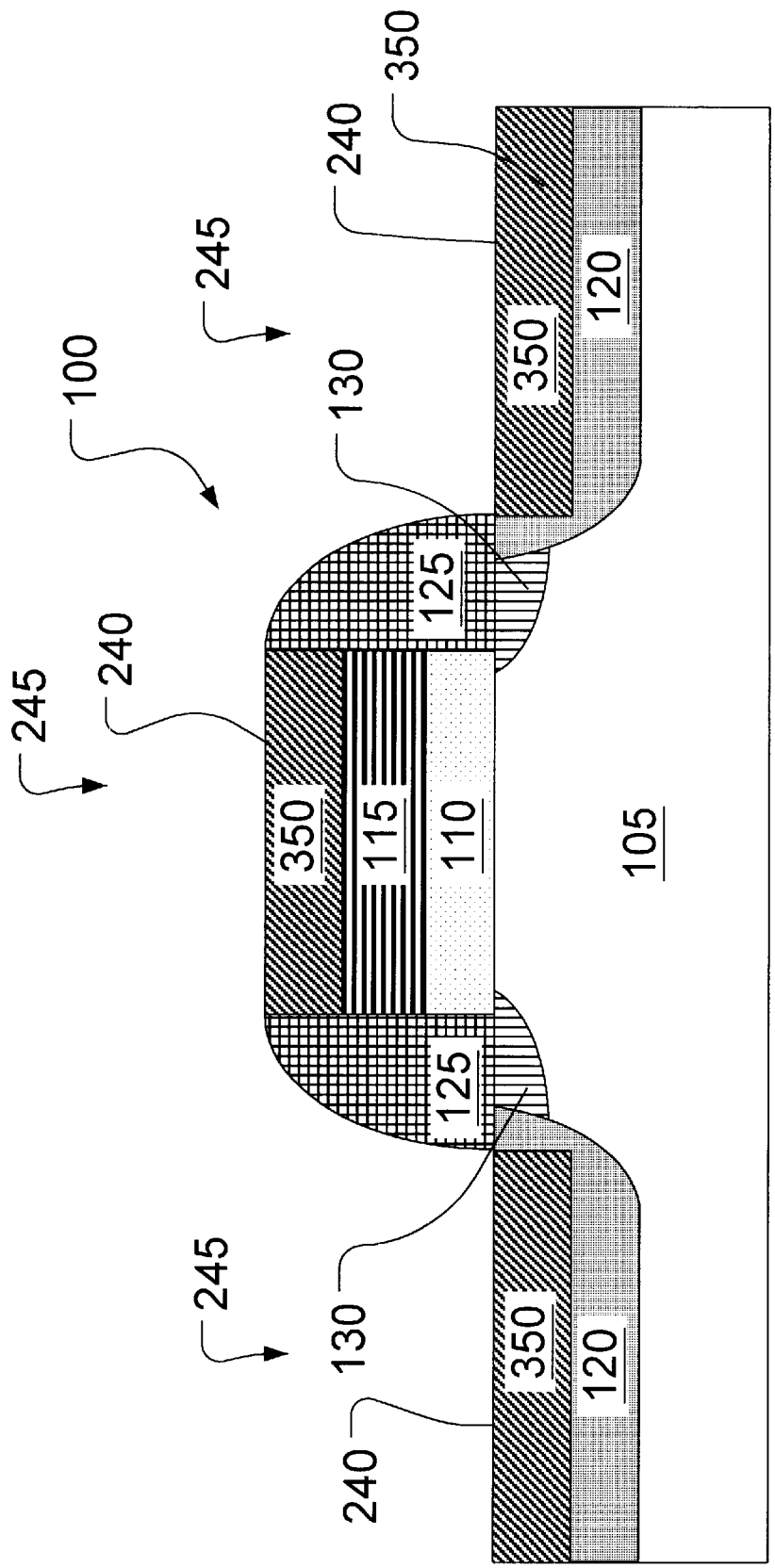

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 4:
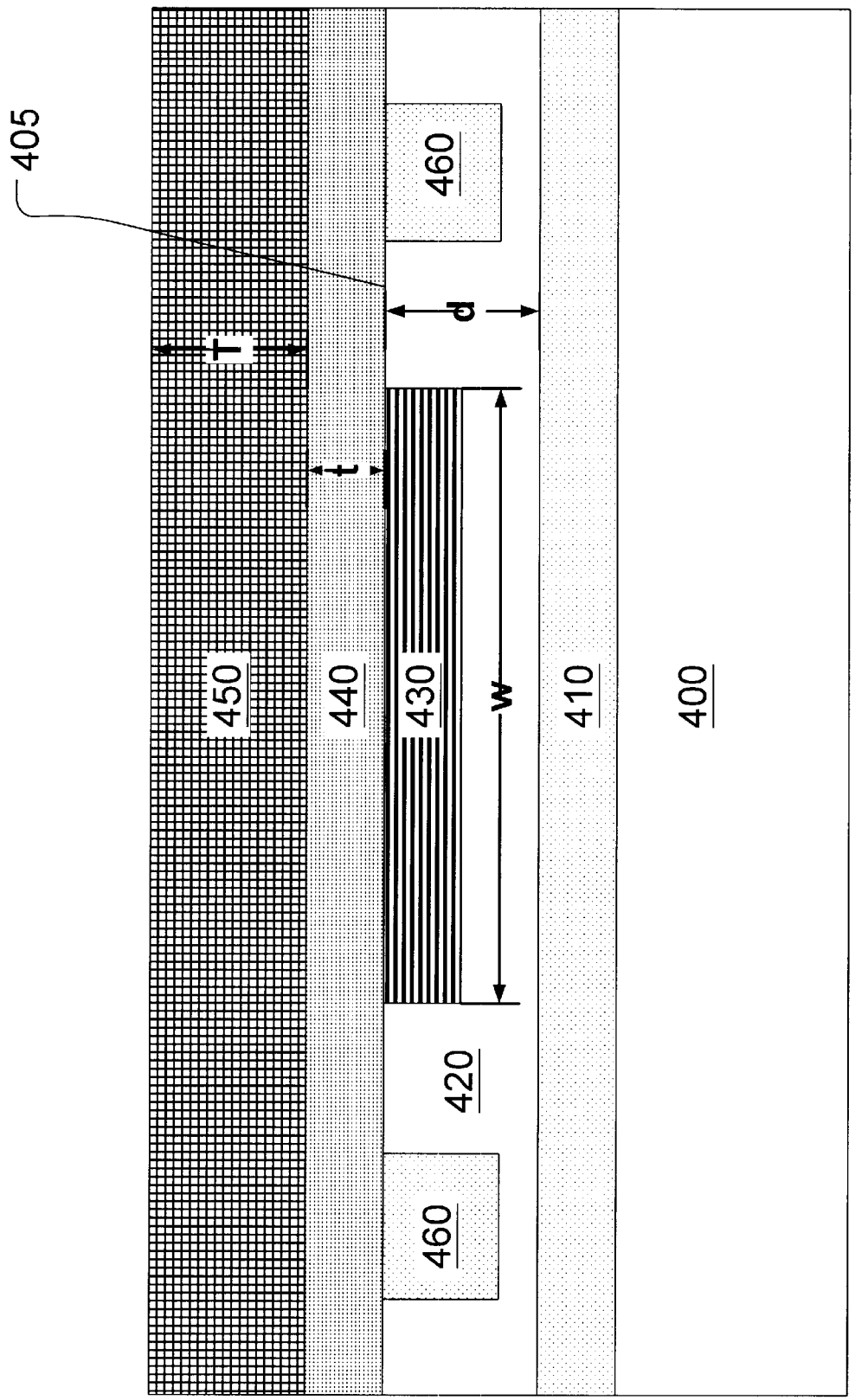
FIGS. 4–10 schematically illustrate various embodiments of a method for manufacturing according to the present invention.
Figure 6:
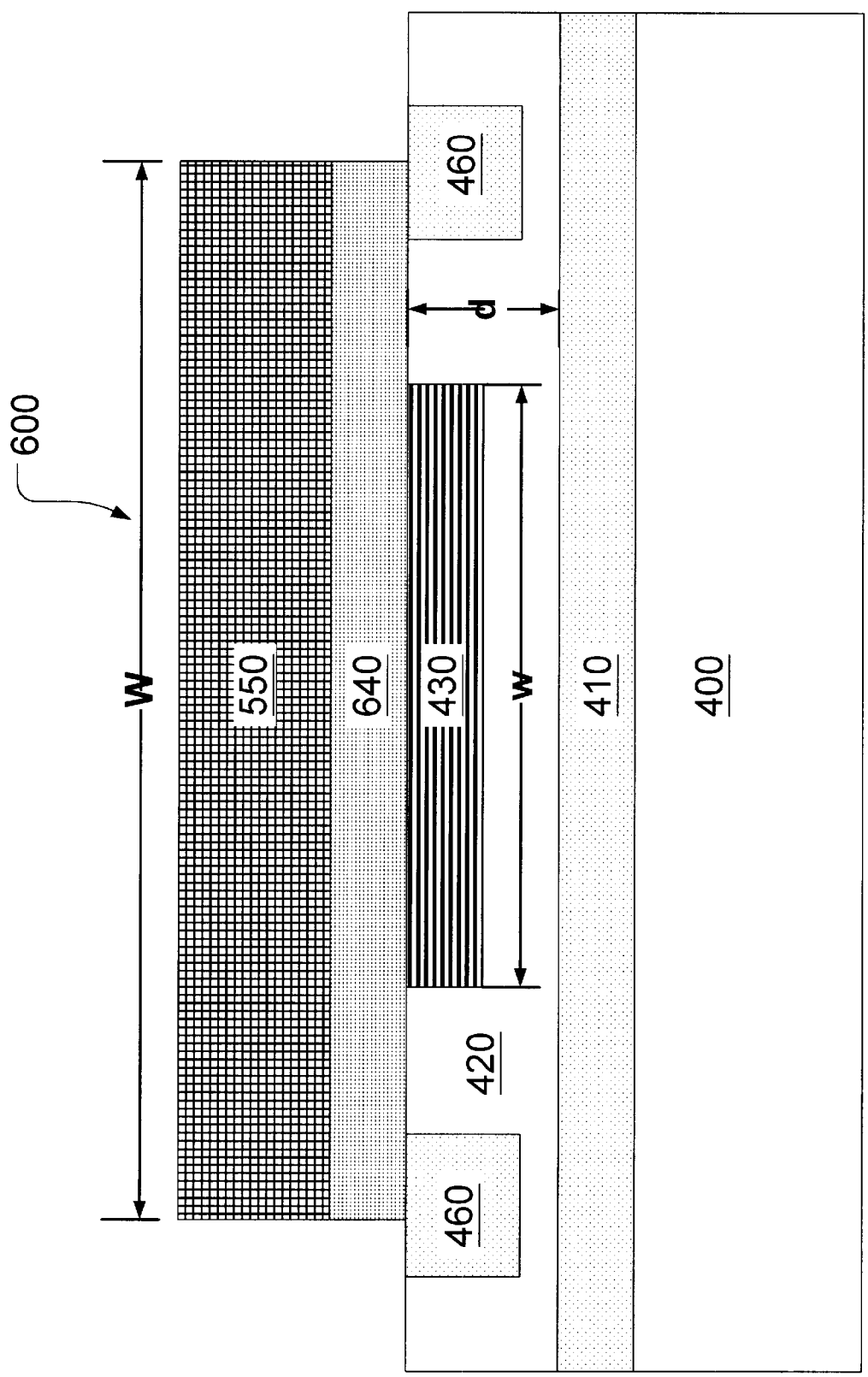
Figure 7:
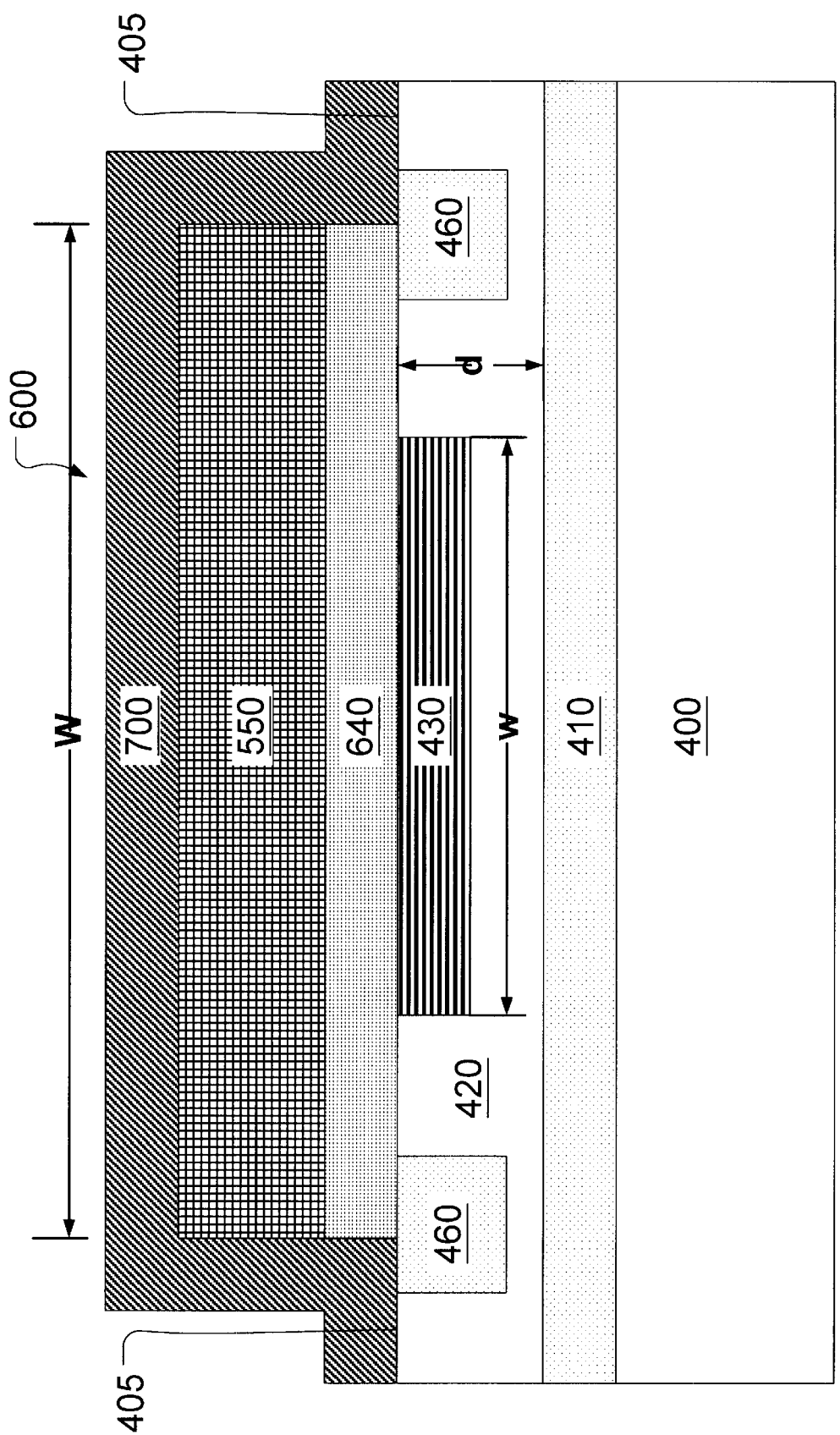
Figure 8:
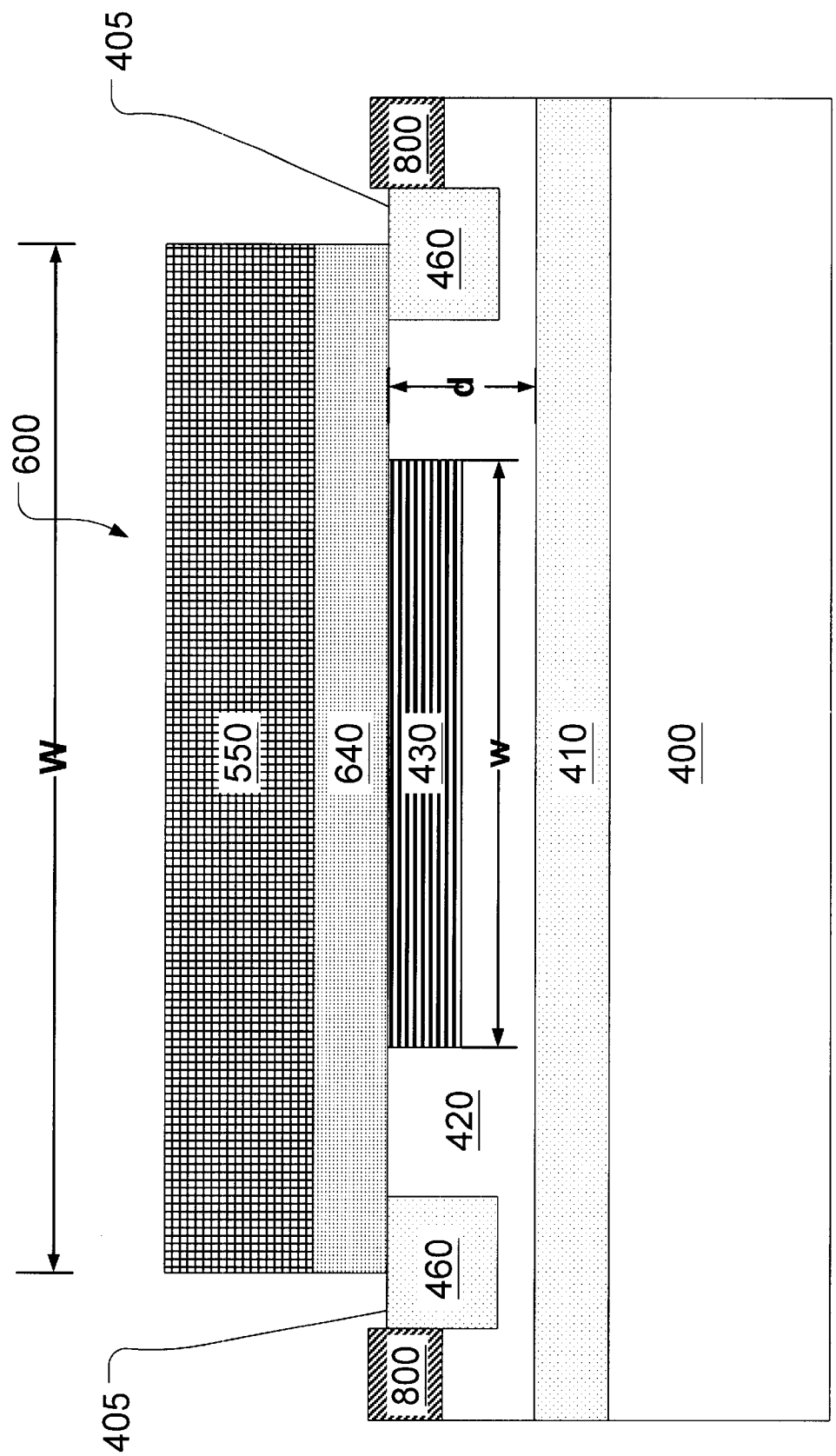
Figure 9:
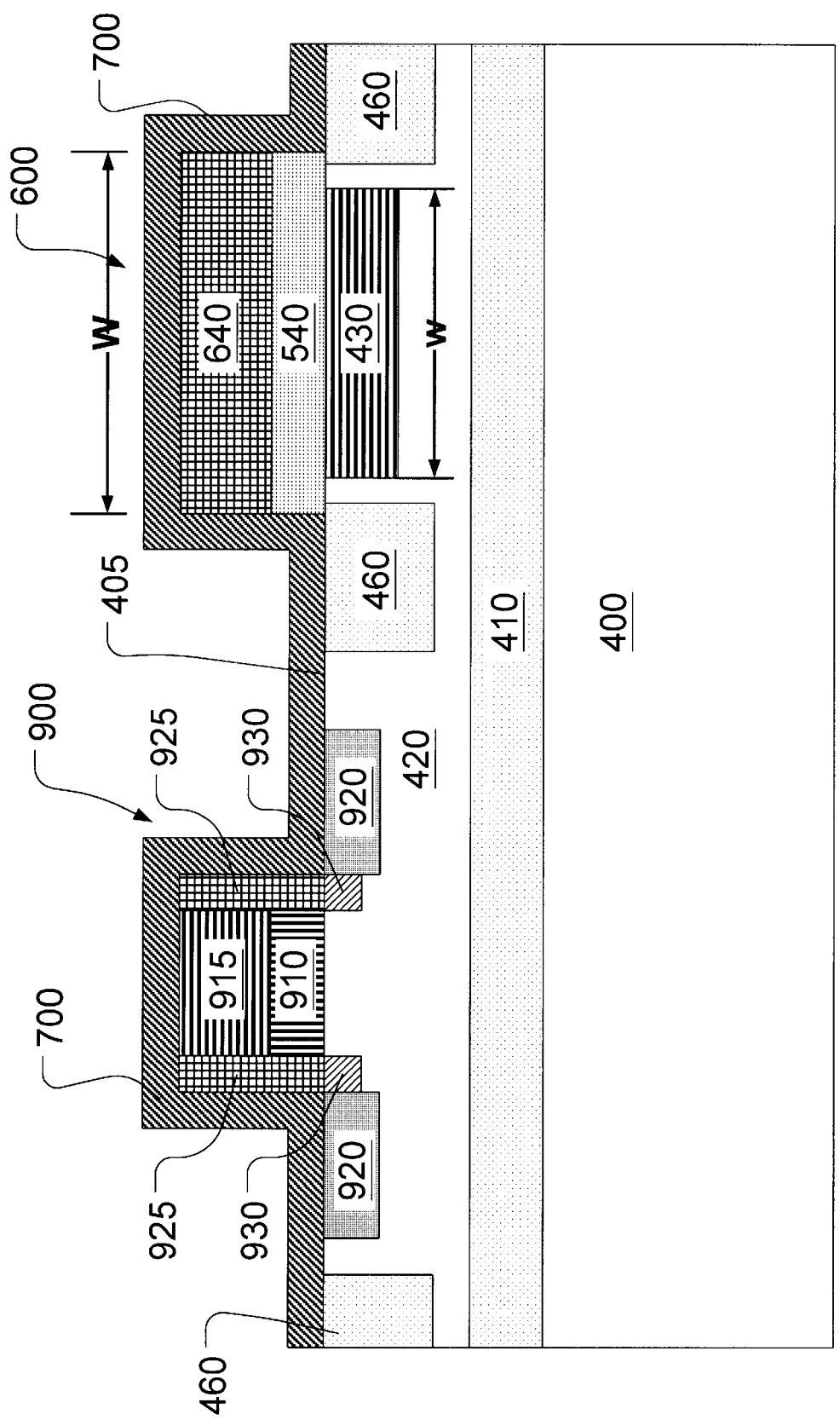

Illustrative embodiments of a method according to the present invention are shown in FIGS. 4–10. As shown in FIG. 4, an undoped polysilicon layer 430 may form a portion of a structure layer 420 such as an epitaxial semiconducting layer. The epitaxial semiconducting layer 420 may be formed above a buried dielectric layer 410. The buried dielectric layer 410 may be formed above a bulk semiconducting substrate 400. The buried dielectric layer 410 may be formed at a depth d in a range of about 1000 Å–5000 Å below a surface 405 of the structure layer 420. The undoped polysilicon layer 430 may be formed to have a width w in a range of about 1000 Å–2500 Å. The undoped polysilicon layer 430 may be formed as a portion of a passive resistor, for example. The undoped polysilicon layer 430 may be separated from other semiconductor devices (such as MOS transistor 900, as shown in FIGS. 8 and 9, described more fully below) by one or more shallow trench isolation (STI) regions 460.

As shown in FIG. 4, a buffer layer 440 may be formed above the undoped polysilicon layer 430 and above the surface 405 of the structure layer 420. The buffer layer 440 may be a nitride etch stop layer. The buffer layer 440 may be formed by a variety of known techniques for forming such layers, e.g., chemical vapor deposition (CVD), low-pressure CVD (LPCVD), plasma-enhanced CVD (PECVD), sputtering, which is also known as physical vapor deposition (PVD), thermal growing, spin-on glass, and the like. The buffer layer 440 may have a thickness t in a range of about 50–200 Å. In one illustrative embodiment, the buffer layer 440 is comprised of either undoped oxide (UDOX), such as undoped silicon dioxide ($SiO_2$), or tetraethyl orthosilicate (TEOS), having a thickness of approximately 50 Å, formed by being blanket-deposited by either a plasma-enhanced CVD (PECVD) process or a low-pressure CVD (LPCVD) process.

As shown in FIG. 4, a dielectric layer 450 may be formed above the buffer layer 440. The dielectric layer 450 may be formed by a variety of known techniques for forming such layers, e.g., chemical vapor deposition (CVD), low-pressure CVD (LPCVD), plasma-enhanced CVD (PECVD), sputtering, which is also known as physical vapor deposition (PVD), thermal growing, spin-on glass, and the like. The dielectric layer 450 may have a thickness T in a range of about 100–900 Å. In one illustrative embodiment, the dielectric layer 450 is comprised of silicon nitride ($Si_3N_4$), having a thickness of approximately 200 Å, formed by being blanket-deposited by either a plasma-enhanced CVD (PECVD) process or a low-pressure CVD (LPCVD) process.

Figure 5:
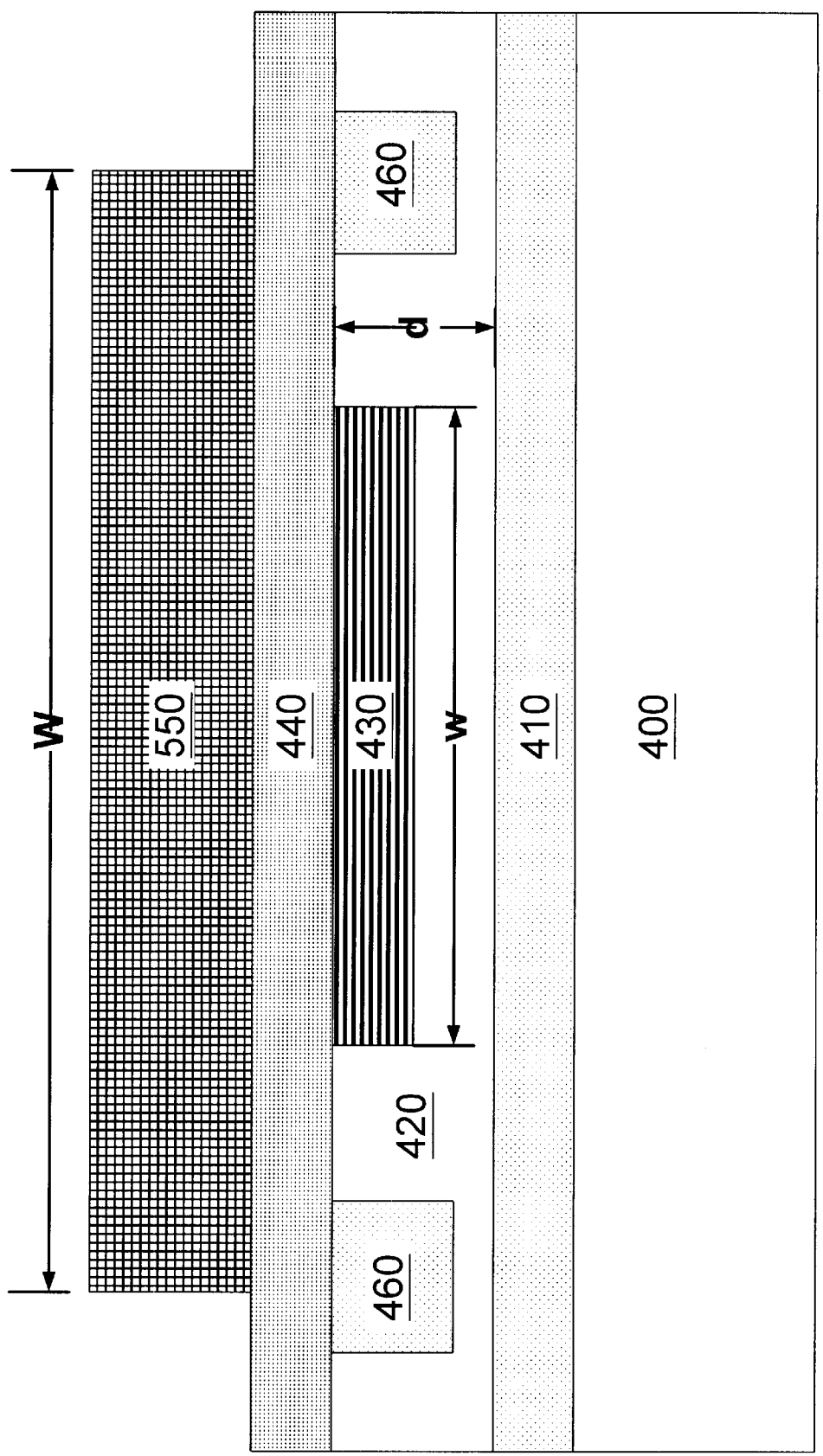

As shown in FIG. 5, the dielectric layer 450 may be patterned, using a photoresist mask (not shown), for example, to form an upper portion 550 of a salicide blocking structure, such as salicide blocking structure 600, as shown in FIG. 6 and as described in more detail below. The upper portion 550 of the salicide blocking structure 600 may have a width W of at least about 1500 Å. The upper portion 550 of the salicide blocking structure 600 may be formed using a variety of known etching techniques, such as an anisotropic etching process.

A selective anisotropic etching technique may be used, such as a reactive ion etching (RIE) process. Plasma etching may also be used, in various illustrative embodiments. Alternatively, a selective isotropic wet etching technique may be used, such as using phosphoric acid ($H_3PO_4$). For example, when hot aqueous phosphoric acid ($H_3PO_4$) is used to selectively etch a silicon nitride ($Si_3N_4$) upper portion 550 of the salicide blocking structure 600, the $Si_3N_4$ etches away fairly steadily, at least at roughly 5–10 times the etch rate of a silicon dioxide ($SiO_2$) buffer layer 440.

The silicon dioxide ($SiO_2$) buffer layer 440 is a nitride etch stop layer and protects underlying silicon (Si) and/or field oxide from removal during an overetch. The overetch may be performed to ensure substantially complete removal of extraneous silicon nitride ($Si_3N_4$) material from the upper portion 550 of the salicide blocking structure 600 for increased salicidation in other areas of the workpiece. This overetch protection against the silicon (Si) loss and/or the field oxide loss can be very significant, particularly in silicon-on-insulator (SOI) applications. As described above, in silicon-on-insulator (SOI) applications, the silicon (Si) film and/or the field oxide thickness are in a range of about 500–2000 Å, much less than in "bulk" applications.

As shown in FIG. 6, a lower portion 640 of the salicide blocking structure 600 may be formed by selectively patterning the buffer layer 440 (FIGS. 4 and 5), by an isotropic and/or an anisotropic etching technique, such as a reactive ion etching (RIE) process using trifluoromethane (fluoroform, $CHF_3$) and argon (Ar) the etchant gases, for example. Alternatively, a wet etching technique may be used, for example. Plasma etching may also be used, in various illustrative embodiments. The respective portions of the buffer layer 440 to be removed to form the lower portion 640 of the salicide blocking structure 600 may be substantially and/or completely removed by a pre-cleaning "dip" performed before the salicidation process begins.

As shown in FIG. 7, a cobalt (Co) metal layer 700 may be blanket-deposited above the surface 405 of the structure layer 420 and above and adjacent the salicide blocking structure 600, following the pre-cleaning dip performed to remove residual dielectric material from areas to be salicided. The cobalt (Co) metal layer 700 may then be subjected to an initial rapid thermal anneal (RTA) process performed at a temperature ranging from approximately 450–800° C. for a time ranging from approximately 15–60 seconds. At surfaces 405 of the structure layer 420 adjacent the shallow trench isolation (STI) regions 460 that are not protected by the salicide blocking structure 600, exposed silicon (Si) reacts upon heating with the cobalt (Co) metal layer 700 to form cobalt silicide ($CoSi_2$) structures 800, as shown in FIG. 8. The cobalt (Co) metal layer 700 is not believed to react with the dielectric salicide blocking structure 600 or the shallow trench isolation (STI) regions 460 upon heating.

As shown in FIG. 8, a wet chemical strip of the cobalt (Co) metal layer 700 removes excess, unreacted portions (not shown) of the cobalt (Co) metal layer 700, leaving behind the salicided cobalt silicide ($CoSi_2$) structures 800 only at, above and/or below the surfaces 405 of the structure layer 420 adjacent the shallow trench isolation (STI) regions 460 that are not protected by the salicide blocking structure 600. The salicided cobalt silicide ($CoSi_2$) structures 800 may then be subjected to a final rapid thermal anneal (RTA) process performed at a temperature ranging from approximately 600–1000° C. for a time ranging from approximately 10–60 seconds.

As shown in FIG. 9, in various illustrative embodiments, a metal oxide semiconductor field effect transistor (MOSFET or MOS transistor) 900 may be formed above structure layer 420. The MOS transistor 900 may have a doped-poly gate 915 formed above a gate dielectric 910 formed above the structure layer 420. The doped-poly gate 915 and the gate dielectric 910 may be separated from $N^+$-doped ($P^+$-doped) source/drain regions 920 of the MOS transistor 900 by dielectric spacers 925. The dielectric spacers 925 may be formed above $N^-$-doped ($P^-$-doped) source drain extension (SDE) regions 930, in various illustrative embodiments, the dielectric spacers 925 and the upper portion 550 of the salicide blocking structure 600 may be formed at substantially the same time.

The $N^-$-doped ($P^-$-doped) source drain extension (SDE) regions 930 are typically provided to reduce the magnitude of the maximum channel electric field found close to the $N^+$-doped ($P^+$-doped) source/drain regions 920 of the MOS transistor 900, and, thereby, to reduce the associated hot-carrier effects. The lower (or lighter) doping of the $N^-$-doped ($P^-$-doped) source drain extension (SDE) regions 930, relative to the $N^+$-doped ($P^+$-doped) source/drain regions 120 of the MOS transistor 900, reduces the magnitude of the maximum channel electric field found close to the $N^+$-doped ($P^+$-doped) source/drain regions 920 of the MOS transistor 900, but increases the source-to-drain resistances of the $N^-$-doped ($P^-$-doped) source drain extension (SDE) regions 930.

As shown in FIG. 9, the cobalt (Co) metal layer 700 may be blanket-deposited above the surface 405 of the structure layer 420, above and adjacent the MOS transistor 900, and above and adjacent the salicide blocking structure 600, following the pre-cleaning dip performed to remove residual dielectric material from areas to be salicided. The cobalt (Co) metal layer 700 may then be subjected to an initial rapid thermal anneal (RTA) process performed at a temperature ranging from approximately 450–800° C. for a time ranging from approximately 15–60 seconds. At surfaces 405 of the structure layer 420 adjacent the shallow trench isolation (STI) regions 460 that are not protected by the salicide blocking structure 600 and at active areas, such as the $N^+$-doped ($P^+$-doped) source/drain regions 920 and the doped-poly gate 915, exposed silicon (Si) reacts upon heating with the cobalt (Co) metal layer 700 to form cobalt silicide ($CoSi_2$). The cobalt (Co) metal layer 700 is not believed to react with the dielectric spacers 925, the dielectric salicide blocking structure 600 or the shallow trench isolation (STI) regions 460 upon heating.

Figure 10:
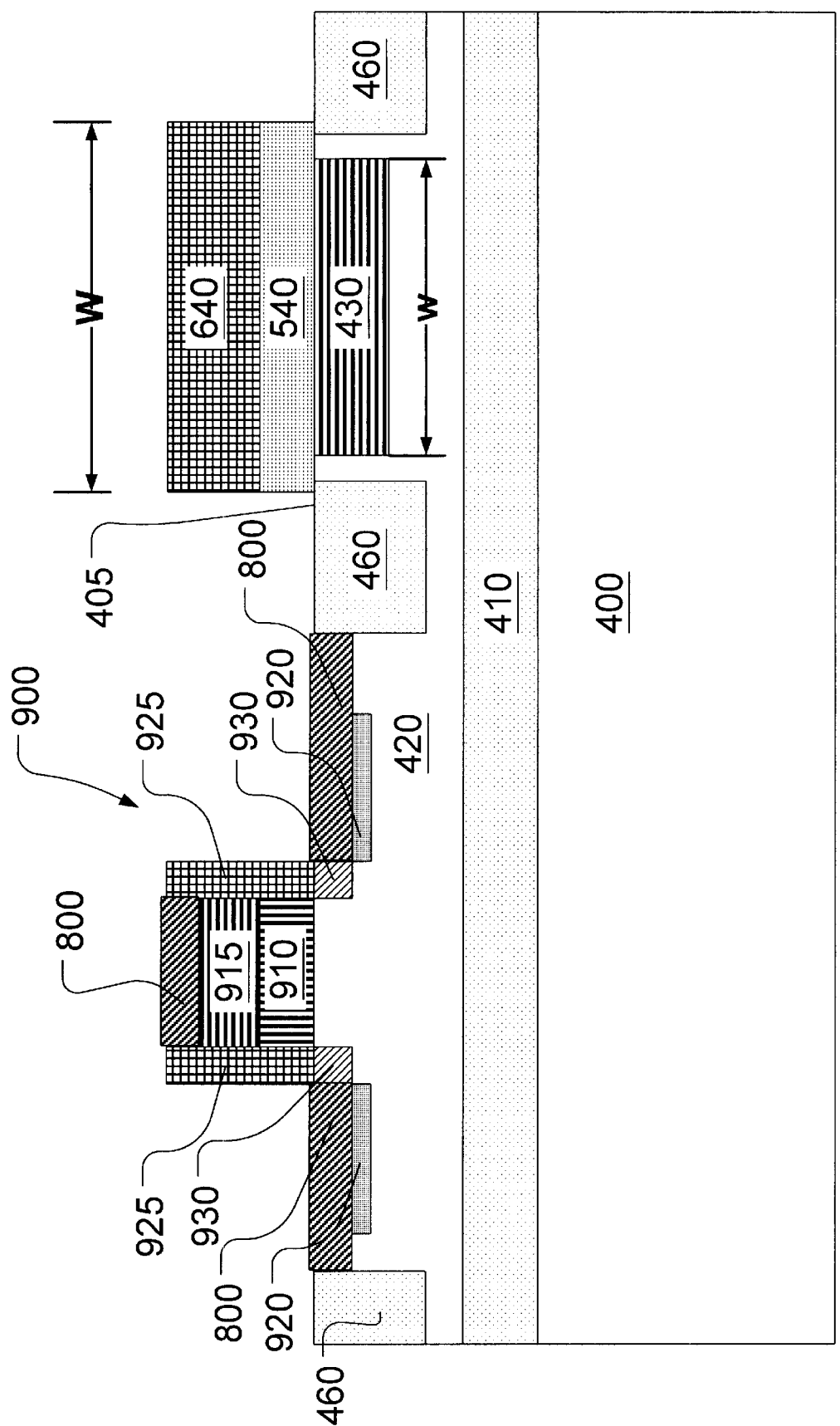

As shown in FIG. 10, a wet chemical strip of the cobalt (Co) metal layer 700 removes excess, unreacted portions (not shown) of the cobalt (Co) metal layer 700, leaving behind the salicided cobalt silicide ($CoSi_2$) structures 800 only at, above and/or below the surfaces 405 of the structure layer 420 adjacent the shallow trench isolation (STI) regions 460 that are not protected by the salicide blocking structure 600 and at active areas, such as the $N^+$-doped ($P^+$-doped) source/drain regions 920 and the doped-poly gate 915. The salicided cobalt silicide ($CoSi_2$) structures 800 may then be subjected to a final rapid thermal anneal (RTA) process performed at a temperature ranging from approximately 600–1000° C. for a time ranging from approximately 10–60 seconds.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b"disclosed herein is to be understood as referring to the power set (the set of all subsets) of the respective range of values, in the sense of Georg Cantor. Accordingly, the protection sought herein is as set forth in the claims below.

What is claimed:

1. A method, comprising:

providing a silicon-on-insulator structure comprising:
a bulk substrate;
a buried insulation layer; and
an active layer;

forming a polysilicon layer in the active layer of the silicon-on-insulator structure layer;

forming a buffer layer above the polysilicon layer and at least a portion of the active layer;

forming a dielectric layer above the buffer layer; and patterning the dielectric layer and the buffer layer to form a salicide block above the polysilicon layer and the at least a portion of the active layer said salicide block protecting the polysilicon layer and the at least a portion of the active layer from a subsequent salicidation.

2. The method of claim 1, wherein forming the active layer comprises forming an epitaxial semiconductor layer.

3. The method of claim 1, wherein forming the active layer comprises forming the active layer having a thickness of about 1000–5000 Å.

4. The method of claim 1, wherein forming the polysilicon layer comprises forming an undoped polysilicon layer having a width of about 1000–2500 Å.

5. The method of claim 1, wherein forming the polysilicon layer comprises forming a passive resistor.

6. The method of claim 1, wherein forming the buffer layer comprises forming the buffer layer having a thickness of about 50–200 Å.

7. The method of claim 1, wherein forming the dielectric layer comprises forming the dielectric layer having a thickness of about 100–900 Å.

8. The method of claim 1, wherein forming the dielectric layer comprises forming the dielectric layer of silicon nitride ($Si_3N_4$).

9. The method of claim 1, further comprising forming at least one shallow trench isolation in the active layer.

* * * * *